US010169529B2

(12) United States Patent
Dong et al.

(10) Patent No.: US 10,169,529 B2
(45) Date of Patent: Jan. 1, 2019

(54) METHOD AND APPARATUS FOR DETERMINING A ROAD NETWORK PARTITIONING BORDER LINE

(71) Applicant: INTERNATIONAL BUSINESS MACHINES CORPORATION, Armonk, NY (US)

(72) Inventors: Wei Shan Dong, Beijing (CN); Ning Duan, Beijing (CN); Peng Gao, Beijing (CN); Guoqiang Hu, Beijing (CN); Xin Zhang, Shanghai (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 485 days.

(21) Appl. No.: 14/944,299

(22) Filed: Nov. 18, 2015

(65) Prior Publication Data

US 2016/0153152 A1 Jun. 2, 2016

(30) Foreign Application Priority Data

Nov. 28, 2014 (CN) .......................... 2014 1 0714194

(51) Int. Cl.
*G06F 17/50* (2006.01)
*G01C 21/32* (2006.01)
(52) U.S. Cl.
CPC .......... *G06F 17/509* (2013.01); *G01C 21/32* (2013.01)
(58) Field of Classification Search
CPC ...................................................... G06F 17/50
USPC ............................................................ 703/1
See application file for complete search history.

(56) References Cited

U.S. PATENT DOCUMENTS

| 7,912,639 | B2 * | 3/2011 | Atarashi | G09B 29/007 |
| | | | | 340/995.14 |
| 8,660,789 | B2 * | 2/2014 | Demiryurek | G01C 21/3492 |
| | | | | 701/414 |
| 9,092,984 | B2 * | 7/2015 | Bahl | G08G 1/164 |
| 9,754,226 | B2 * | 9/2017 | Zheng | G06Q 10/06 |
| 2009/0048769 | A1 | 2/2009 | Xu et al. | |
| 2009/0213004 | A1 | 8/2009 | Rhodes | |

(Continued)

FOREIGN PATENT DOCUMENTS

| CN | 1713765 A | 6/2004 |
| CN | 1849007 A | 1/2006 |
| CN | 101541013 A | 3/2008 |

OTHER PUBLICATIONS

Anwar et al., "Spatial Partitioning of Large Urban Road Networks" 17th Int'l. Conf on Extending Database Technology, Mar. 24-28, 2014; pp. 343-354.

*Primary Examiner* — Andy Ho
(74) *Attorney, Agent, or Firm* — Cantor Colburn LLP; Vazken Alexanian

(57) ABSTRACT

Embodiments of the present invention disclose a technical solution of determining a border between road network partitions, comprising: determining a border point based on road network data and partitioning information of road segments in the road network; determining a buffer zone between adjacent partitions based on the border point, the partitioning information of the road segments, and the road network data; determining a border between the adjacent partitions based on the buffer zone. With the solution of the present invention, border lines for road network partitions can be accurately determined.

20 Claims, 11 Drawing Sheets

(56) References Cited

U.S. PATENT DOCUMENTS

| | | | |
|---|---|---|---|
| 2010/0286903 A1* | 11/2010 | Meschenmoser | G01C 21/32 701/532 |
| 2010/0299370 A1* | 11/2010 | Otto | G01C 21/32 707/803 |
| 2013/0142438 A1 | 6/2013 | Schloegel et al. | |

* cited by examiner

METHOD AND APPARATUS FOR DETERMINING A ROAD NETWORK PARTITIONING BORDER LINE

FOREIGN PRIORITY

This application claims priority to Chinese Patent Application No. 201410714194.1; filed Nov. 28, 2014, and all the benefits accruing therefrom under 35 U.S.C. § 119, the contents of which in its entirety are herein incorporated by reference.

BACKGROUND

Embodiments of the present invention relate to the field of road network data processing, and more specifically, relate to a method and apparatus for determining respective partition border lines in a road network.

At present, location-based services become increasingly prevalent. The connected-vehicle system as shown in FIG. 2A is a common location-based service. In a connected-vehicle system as shown in FIG. 2A, a distributed server environment is generally adopted, such that when an online location-based connected-vehicle service is provided, it can not only ensure the scalability, but also support acquisition and processing of mass-scale vehicle-carried data.

In view of the spatial characteristics of the vehicle mobility data and connected-vehicle service requests, a road network partition-based load distribution is an effective distributed policy, i.e., partitioning the entire road network into a plurality of areas (e.g., the road network data of partitions A, B, and C in FIG. 2A are deposited in servers 204A, 204B, and 204C, respectively), each server being responsible for processing data and service requests within one or more areas. In prior arts, partitioning a road network generally considers the following two factors: the first is that the loads for data processing and service processing within respective road network areas formed by partitioning should be balanced as much as possible; the second is that the occurrences of cross-partition movement of vehicles should be kept as small as possible, so as to prevent extra processing overheads for data synchronization and service switch caused by cross-partition movement of vehicles on the connected-vehicle service platform.

The connected-vehicle system as shown in FIG. 2A needs to determine which server should be assigned to process based on the location information of the mobility data and the service request. For example, a messaging gateway 201 receives location data (e.g., vehicle-carried data) of high-frequency samples from various user equipments 202 on the fly. Generally, in a road network-based partitioning manner, one partition is a set of road segments and nodes, not a geographical space defined through a spatial geometric shape, such that a physical coordinate point cannot be directly mapped to a corresponding road network partition; therefore, it cannot be directly used for data distribution decision based on the road network partitions. In view of the above, only when a border line in the spatial geometric sense is determined for each road network partition, can it be used for message distribution in the messaging gateway.

FIG. 2B shows a convex polygon method for determining a road network partition border. The black bold line 205 in the figure is a convex polygon border determined based on road network partitions included therein (FIG. 2B only shows a part of the convex polygon). It can be clearly seen from FIG. 2B that the border defined by the convex polygon will also include other road network partitions therein (see the part shown by "X" in FIG. 2B). Because road network data of different areas is generally placed in different servers, the request will constantly hop between servers.

SUMMARY

According to one embodiment, there is provided a method for determining a road network partitioning border line. The method may comprise: determining a border point based on road network data; determining a buffer zone between adjacent partitions based on the border point, partitioning information of the road segment, and the road network data; determining a border line segment between the adjacent partitions based on the buffer zone; and determining a border line of at least one partition based on the border line segment.

According to another embodiment, there is provided a system for determining a road network partitioning border line. The system may comprise: a border point determining module configured to determine a border point based on road network data; a buffer zone determining module configured to determine a buffer zone between adjacent partitions based on the border point, partitioning information of road segments in the road network, and the road network data; a border line segment determining module configured to determine a border line segment between the adjacent partitions based on the buffer zone; and a border line determining module configured to determine a border line of at least one partition based on the border line segment.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some preferable embodiments will be described in more detail with reference to the accompanying drawings, where the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
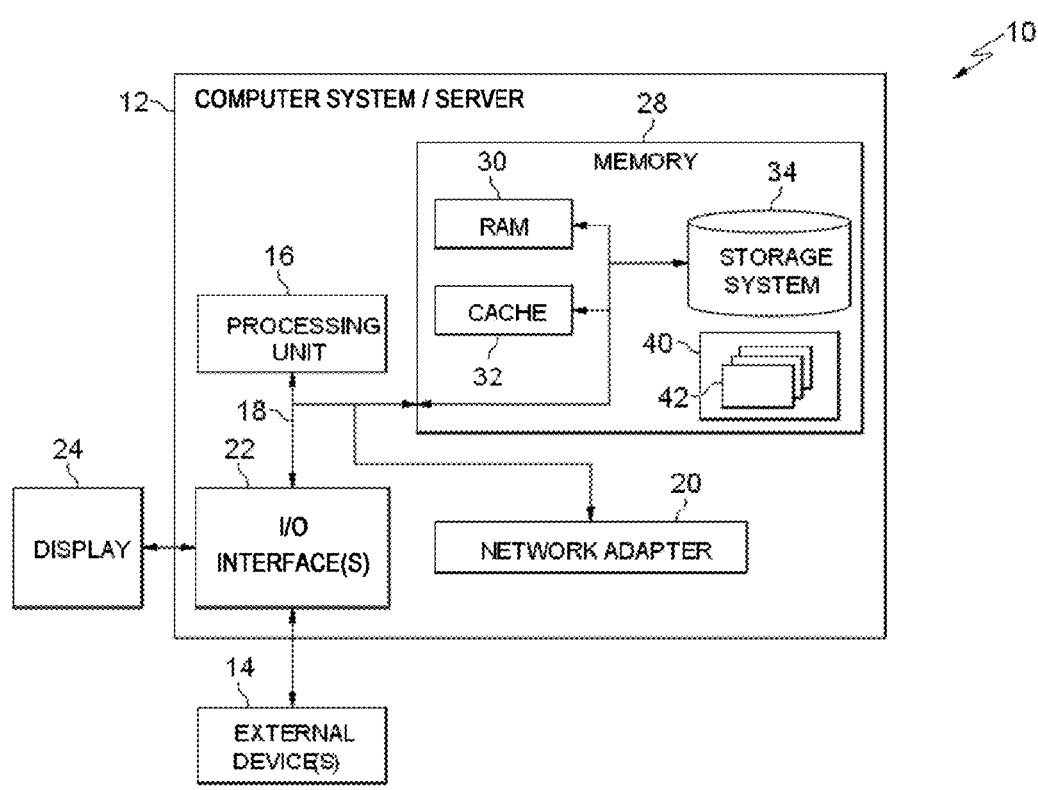
FIG. 1 shows a block diagram of an exemplary computer system/server 12 which is applicable to implement embodiments of the present invention.
Figure 2A:
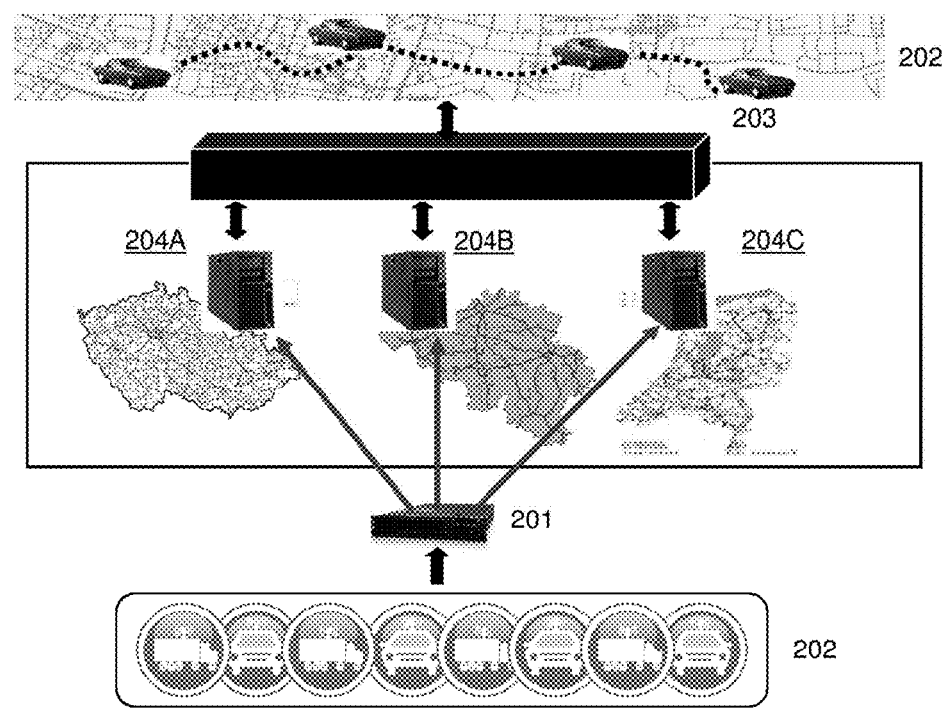
FIG. 2A shows a schematic block diagram of an Internet of Vehicles system in the prior art.
Figure 2B:
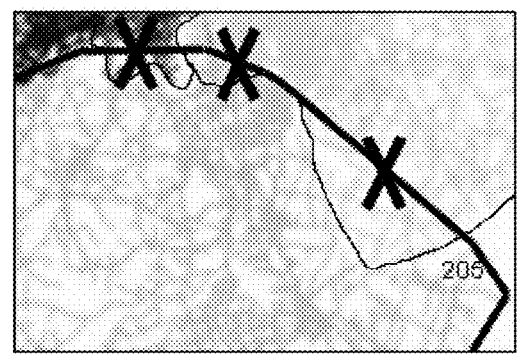
FIG. 2B shows a schematic diagram of determining a road network partitioning border line in the prior art.

Referring now to FIG. 1, where an exemplary computer system/server 12 which is applicable to implement embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

Figure 3:
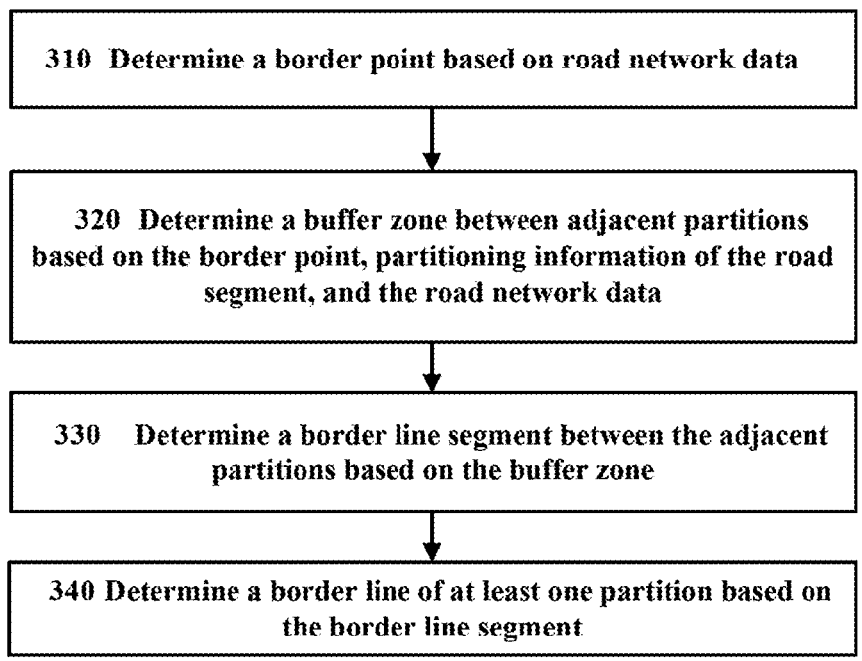
FIG. 3 shows a schematic flow diagram of a method for determining a road network partitioning border line according to one exemplary embodiment of the present invention.

FIG. 3 shows a schematic flow diagram of a method 300 for determining a road network partitioning border line according to one exemplary embodiment of the present invention. As shown at block S310, a border point is determined based on road network data. In one embodiment, road network data is a type of data source. What is processed in each step is the data for the same road network. Through the road network data, information about nodes or road segments in the road network may be obtained, e.g., node ID, node coordinate, road segment ID, road segment start point and endpoint coordinates, relationship between road segments and nodes, relationship between road segments, etc. Besides, in the road network data, not only information about a road segment may be indexed through the road segment, but also information about a node may be indexed through the node. The road network data may employ any existing file format for road network data exchange, e.g., Shape format, mif format, and osm format. As to how to obtain desired information from these road network data files, it is well known to those skilled in the art, and Applicant here will not describe its implementation details.

The partition data of the road segment records the partition which each road segment belongs to in the road network. In one embodiment, the partition data of the road segment may comprise a plurality of data entries, each data entry including a serial number of a road segment, and information about the partition to which the road segment belongs.

Figure 4A:
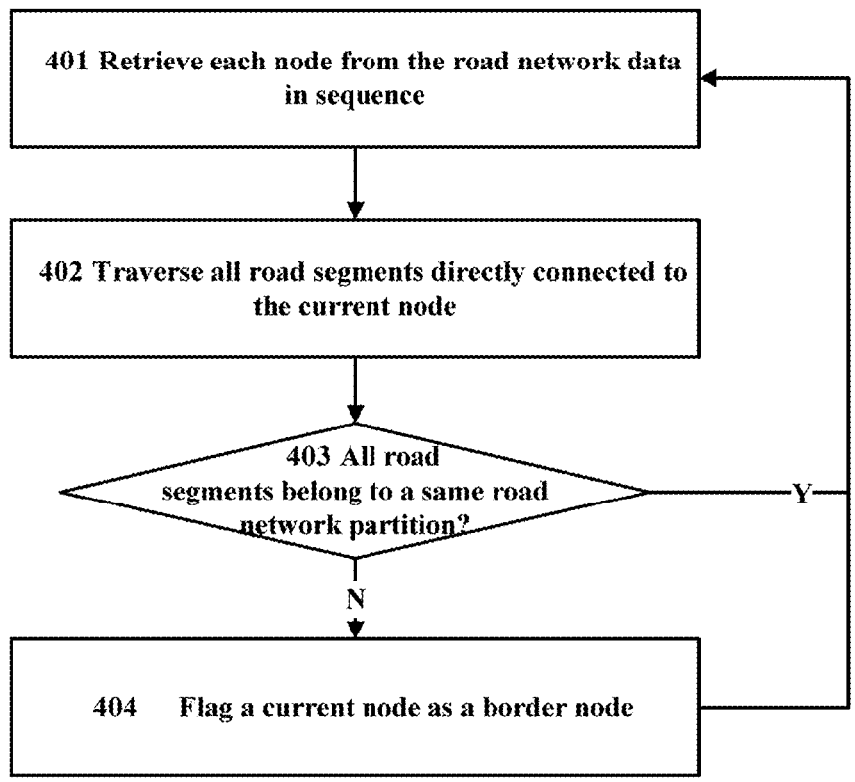
FIG. 4A shows a flow diagram of a method for determining a first kind of border points according to one exemplary embodiment of the present invention.
Figure 4B:
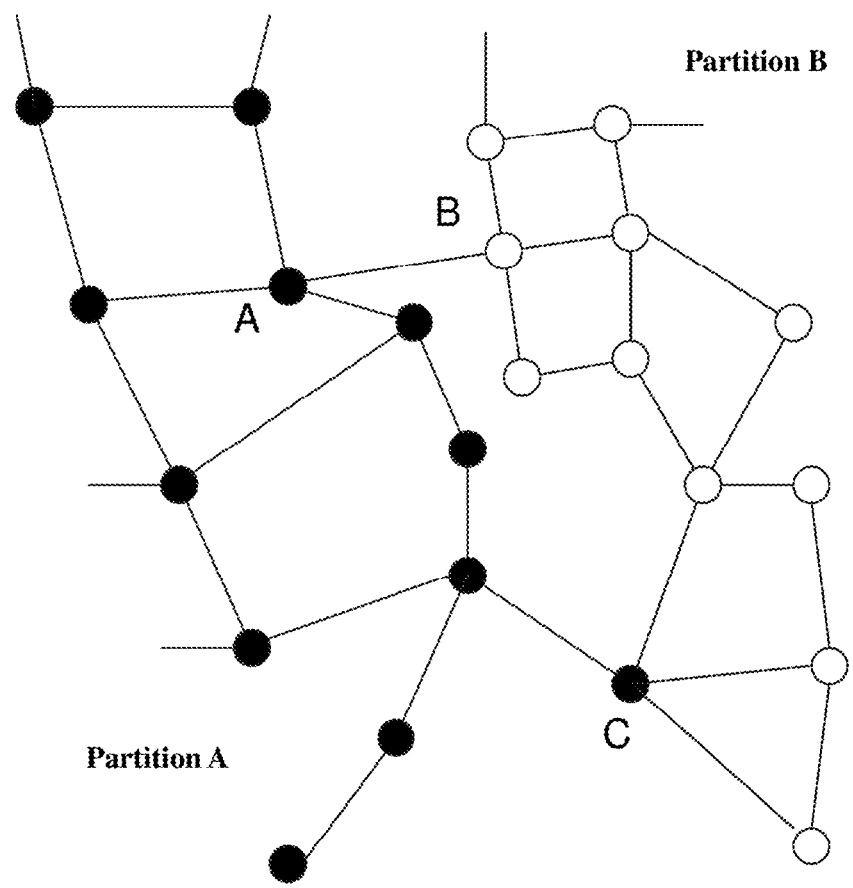
FIG. 4B shows a location diagram of the first kind of border points as determined according to the flow of FIG. 4A.

In one embodiment, determining a border point based on the road network data comprises: for each node in the road network, determining partition information of a road segment connected to the node based on the road network data and partitioning information of road segments in the road network; if the road segment connected to the node has different partitions, determining the node as a first kind of border points. FIG. 4A shows a specific flow diagram of determining a first kind of border points according to this embodiment. As shown at block 401, each node is retrieved from the road network data in sequence. Next, as shown at block 402, all road segments directly connected to the current node are traversed. As shown at block 403, whether all road segments belong to the same road network partition is determined. In response to a yes, the method proceeds to block 401, otherwise the method proceeds to block 404. As shown at block 404, a current node is flagged to a border node. FIG. 4B shows a location schematic diagram of a first kind of border points determined according to the flow of FIG. 4A, wherein an area where a solid node is located belongs to partition A, while an area where a hollow node is located belongs to partition B. Nodes A and C are the first kind of border points due to having road segments connected to different partitions.

Figure 5A:
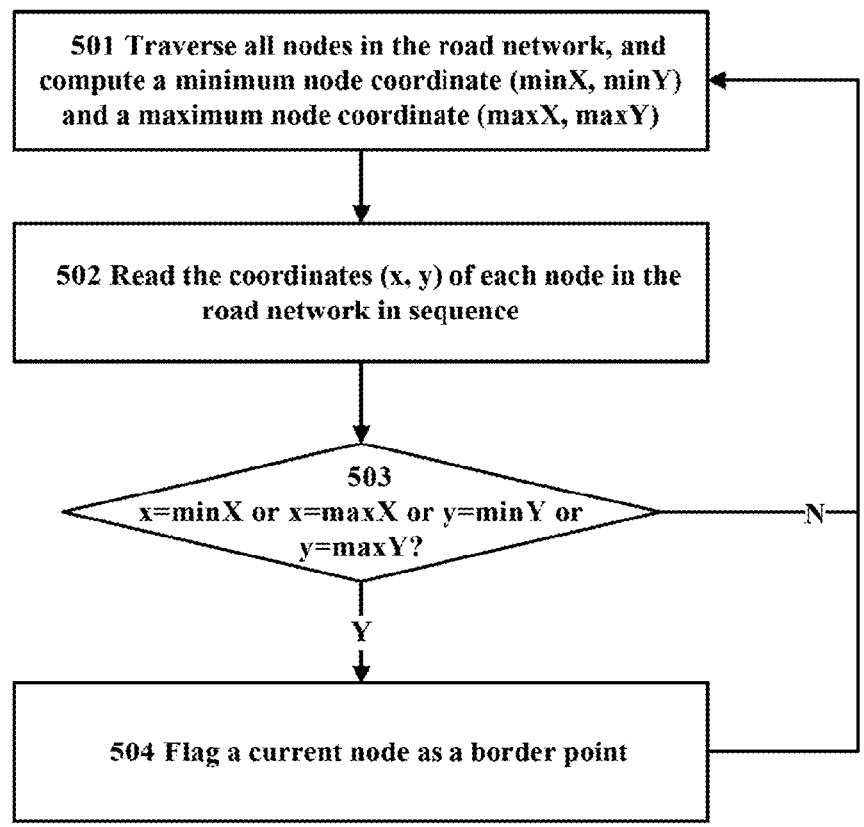
FIG. 5A shows a flow diagram of determining a second kind of border points according to one exemplary embodiment of the present invention.
Figure 5B:
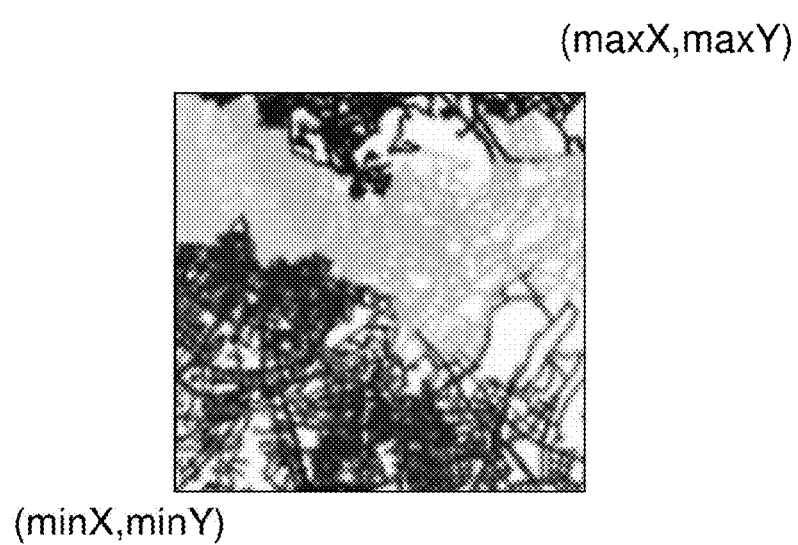
FIG. 5B shows a schematic diagram of determining a second kind of border points according to the flow of FIG. 5A.

In another embodiment, the step of determining a border point comprises: determining an envelope of the road network based on the road network data; determining nodes on the envelope of the road network as a second kind of border points. FIG. 5A shows a flow diagram of determining a second kind of border points according to one exemplary embodiment of the present invention. In this embodiment, the envelope is a minimum rectangle that can completely cover the road network. As shown at block 501, location coordinates of all nodes in the road network are traversed to calculate the minimum x/y coordinates (min X, min Y) and the maximum x/y coordinates (max X, max Y). FIG. 5B shows a schematic diagram of determining a second kind of border points according to the flow of FIG. 5A, wherein (min X, min Y) represents the bottom left corner apex of the rectangle, while (max X, max Y) represents the upper right corner apex of the rectangle. In one embodiment, the rectangle determined based on the two apexes may be used as the envelope of the road network.

As shown at block 502, the coordinate (x, y) of each node in the road network is read in sequence. As shown at block 503, it is determined whether at least one of x=min X, x=max X, y=min Y, y=max Y is satisfied? In response to a yes, the method proceeds to block 504; and in response to a no, the method proceeds to block 502. As shown at block 504, the current node is flagged as a second kind of border points.

Next, return to block 320 of FIG. 3. A buffer zone between adjacent partitions is determined based on the border point, partitioning information of the road segment, and the road network data. Specifically, in one embodiment, determining a buffer zone comprises: selecting a border point as a start point, and determining an initial road segment based on the start point; proceeding to a next road segment along a preset direction based on the initial road segment, till proceeding to the initial road segment; and determining the buffer zone based on the road segment as traversed.

Figure 6A:
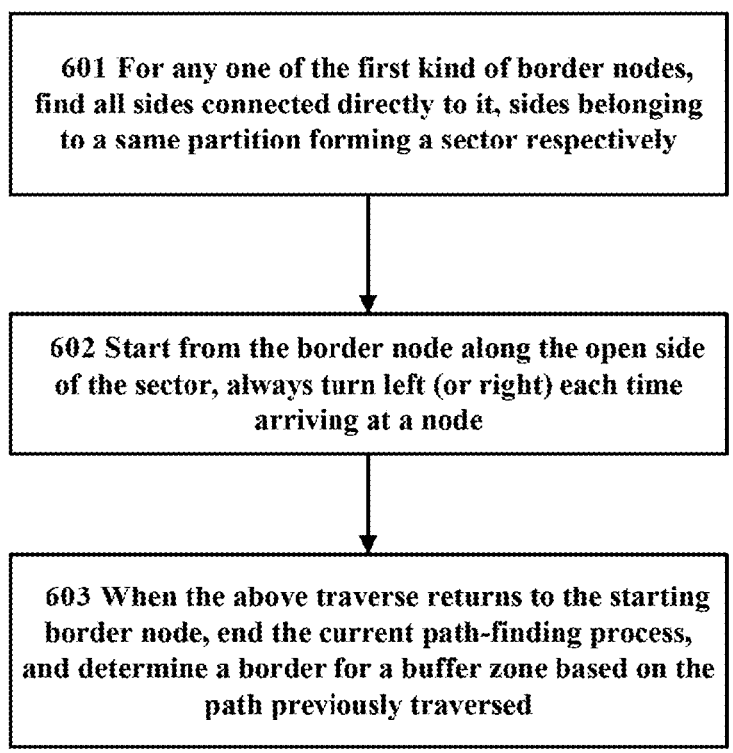
FIG. 6A shows a flow diagram of a method for determining a buffer zone according to one exemplary embodiment of the present invention.
Figure 6B:
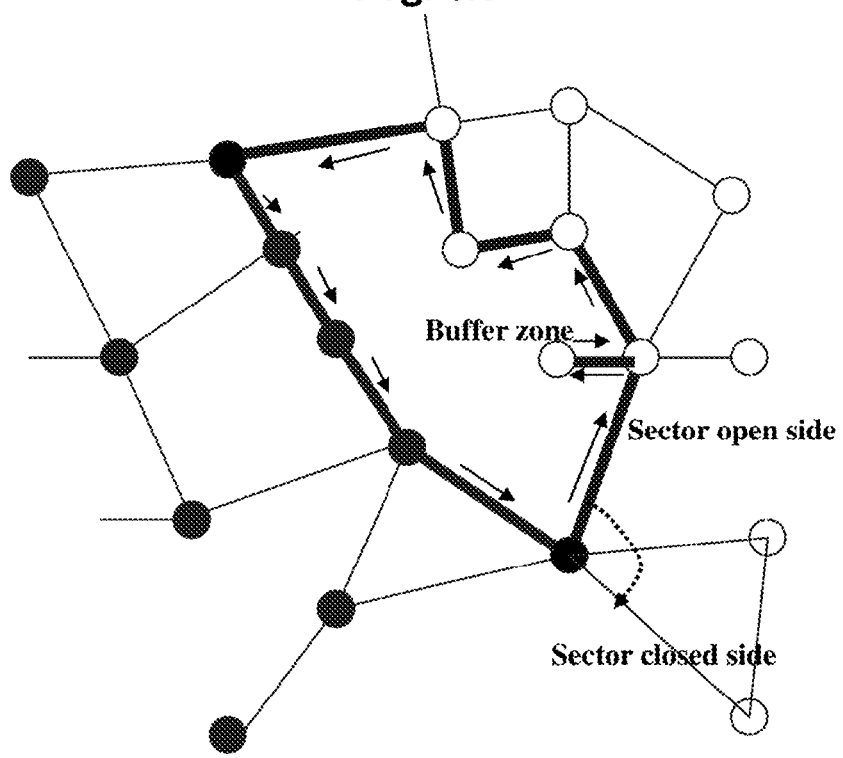
FIG. 6B shows a schematic diagram of determining a buffer zone according to the flow of FIG. 6A.

FIG. 6A shows a flow diagram of a method for determining a buffer zone according to one exemplary embodiment of the present invention. FIG. 6B shows a schematic diagram of determining a buffer zone according to a flow of FIG. 6A. As shown at block 601, any node of the first kind of border nodes is selected to determine all road segments directly connected to the node and partitioning information of said all road segments. Sides belonging to a same partition will be determined as a sector, respectively. The outermost sides of the sector become an open side and a closed side of the sector; the open side and the closed side may be named as per a clockwise (or counterclockwise) direction. As shown at block 602, start from the border node along the open side of the sector, always turn left (or right) each time arriving at a node. In one embodiment, in the case of being unable to proceed forward upon arrival at a node, turn around to proceed in a reverse order. As shown at block 603, in response to execution at block 602, the starting border node is arrived and the current pathfinding process ends, and a border for a buffer zone is determined based on paths previously traversed.

Figure 7A:
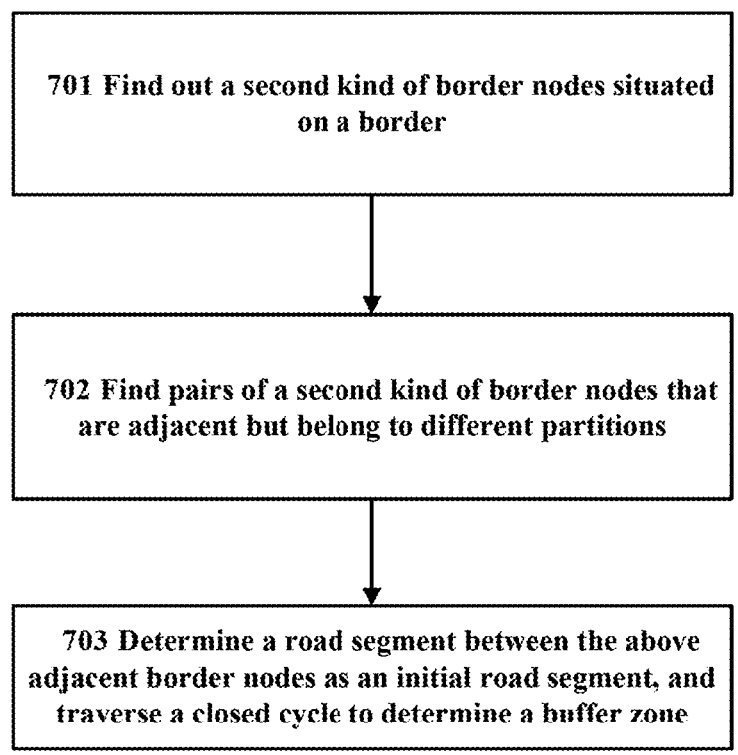
FIG. 7A shows a schematic diagram of a method for determining a buffer zone according to another exemplary embodiment of the present invention.
Figure 7B:
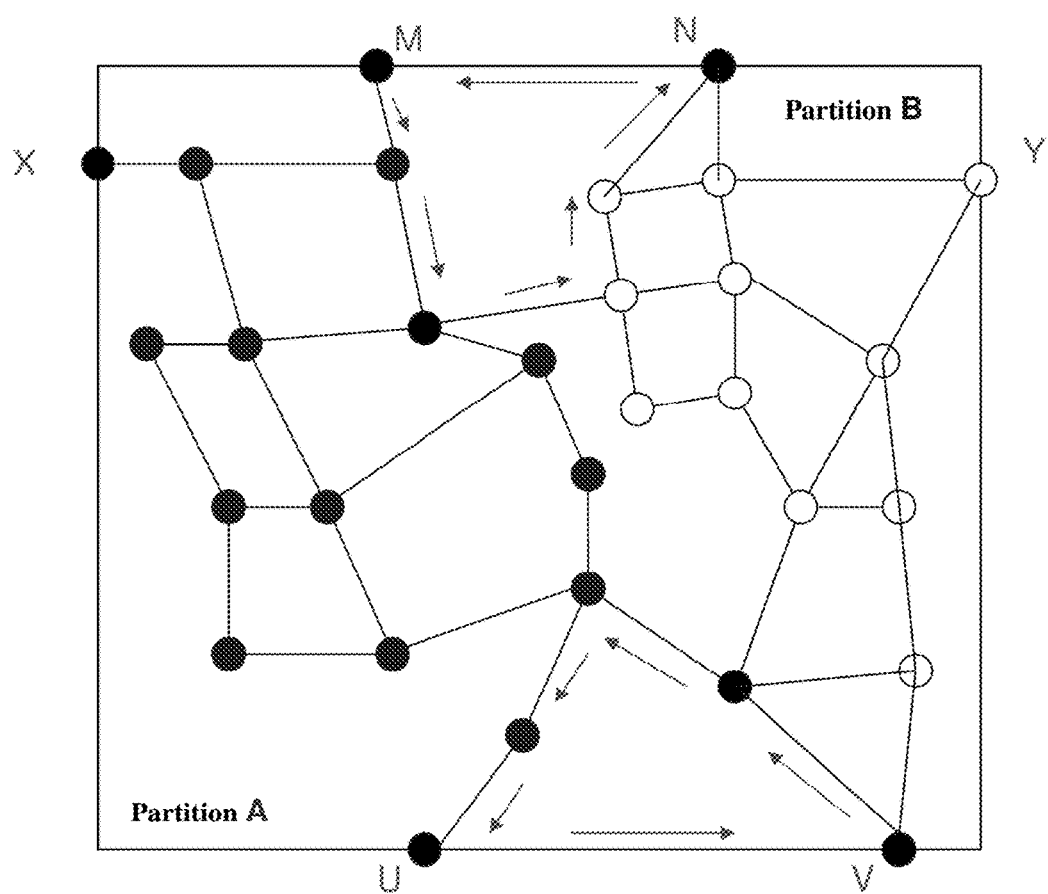
FIG. 7B shows a schematic diagram of determining a buffer zone according to the flow of FIG. 7A.

FIG. 7A shows a flow diagram of a method for determining a buffer zone according to another exemplary embodiment of the present invention; FIG. 7B shows a schematic diagram of determining a buffer zone according to the flow of FIG. 7A. As shown at block 701, a second kind of border nodes situated on a border are to be found, for example, border points M, N, X, Y, U, V as shown in FIG. 7B. As shown at block 702, pairs of second kind of border nodes that are adjacent but belong to different partitions are to be found, e.g., border points M/N or border points U/V in FIG. 7B. As shown at block 703, a road segment between the above adjacent border nodes is determined as an initial road segment. Next, a closed loop is traversed to determine a buffer zone. As shown in FIG. 7B, after the initial road segment MN is determined, its specific pathfinding process may refer to the above other embodiments.

Returning to block 330 of FIG. 3, a border line segment between adjacent partitions may be determined based on the buffer zone. At least one buffer zone can be determined according to previous steps, and a border line segment can be determined based on each buffer zone; in subsequent steps, the border line for each partition can be determined based on all border line segments.

Because GPS data has a certain measurement deviation, when a location point is close to the border line, it is likely that the location point is mapped to an adjacent partition. Thus, in a further embodiment of the present application, an enough gap is provided between the border line close to the partition and an adjacent partition, thereby preventing erroneous mapping caused by GPS measurement deviation.

Figure 8A:
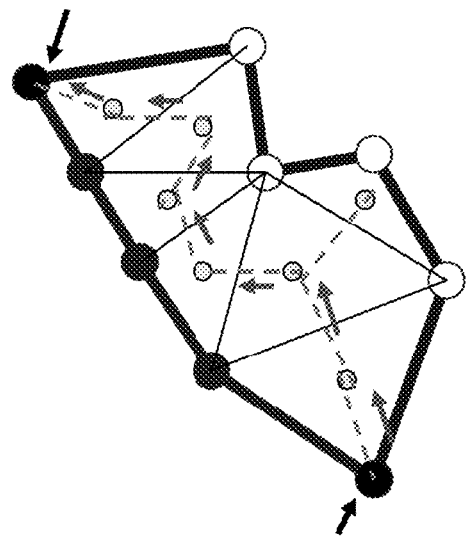
FIG. 8A shows a first embodiment of determining a border line segment of a buffer zone through a triangular partition.

FIG. 8A shows a first embodiment of determining a border line segment of a buffer zone through triangular partition. As shown at block 801, triangularly partition the buffer zone. As shown in FIG. 8A, every three nodes can determine a triangular area. In one embodiment, it is attempted that each border point only belongs to one triangular area. As shown at block 802, determine a central point of each triangle. As shown at block 803, determine the border line segment based on the border point and centers of respective triangular areas after the triangular partition. Specifically, determine a border line segment corresponding to each buffer zone based on each border point and the triangular area where the border point is located.

Figure 8B:
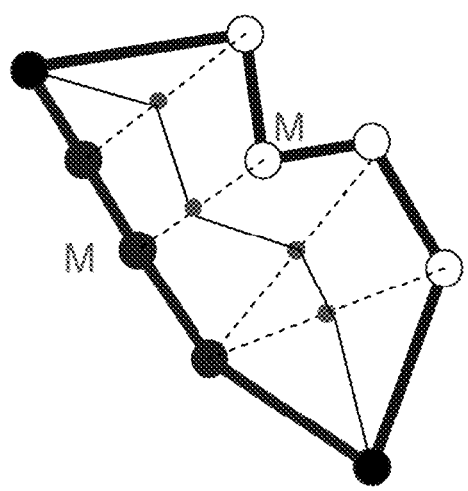
FIG. 8B shows a second embodiment of determining a border line segment.

FIG. 8B shows a second embodiment of determining a border line segment. This embodiment includes two sub-steps. In a first sub-step, a plurality of pairs of nodes are determined, nodes in the pairs of nodes belonging to different partitions. M1, M2 in FIG. 8B are an example of a pair of nodes, wherein node M1 belongs to a left partition (the area where the solid node is located), and node M2 belongs to a right partition (the area where the hollow node is located). In the second sub-step, the border line segment based on middle points of connection lines of the pairs of nodes and the border point is determined. For example, every two middle points may be connected and then connected to a border node, thereby forming a physical partition line of the partition, which is a border line segment corresponding to the buffer zone.

Figure 8C:
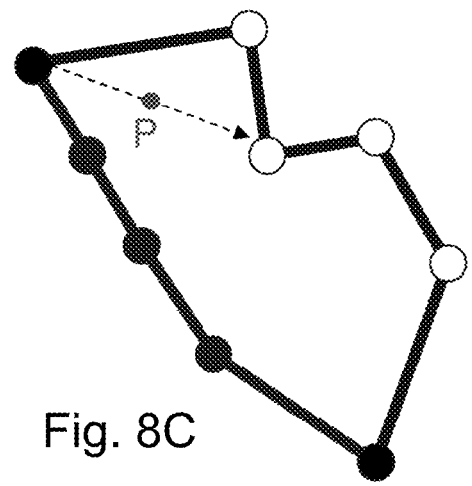
FIGS. 8C, 8D and 8E shows a third embodiment of determining a border line segment.
Figure 8D:
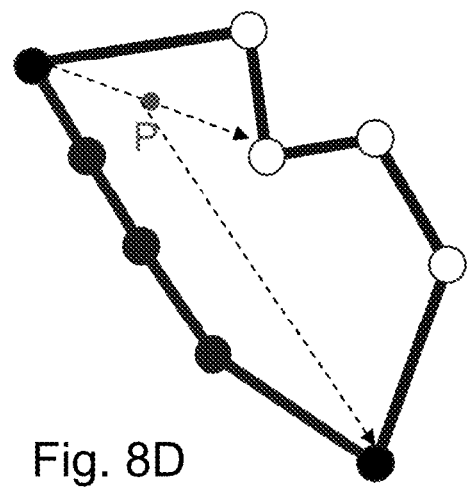
Figure 8E:
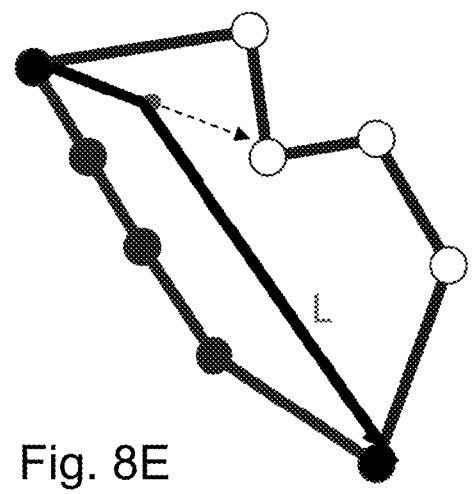

FIG. 8C shows a solution of determining a border line segment in a buffer zone according to a third embodiment. It specifically comprises: determining, based on the angle bisector of the interior angle where a border point is located, a first line segment formed by intersection of the bisector and the border of the buffer zone; take a middle point of the first segment (see middle point P in FIG. 8D as a start point of the next step; start from the new start point, draw a straight line to another border node; if the straight line does not intersect in the buffer zone with the border of the buffer zone, the partitioning procedure ends, and the resulting partition line is a polyline denoted by L in FIG. 8E; if the straight line is intersected in the buffer zone with the buffer zone border to form a second line segment, then the second line segment acts as the first line segment, and its middle point is taken as a start point of the next step to continue the above mentioned steps.

Returning to FIG. 3, the method shown in FIG. 3 further comprises block 340, where a border line of at least one partition is determined based on the border line segment. It is seen from the above description that the border line segment is described by coordinates of a series of points. Therefore, all points forming the border line segment of a border line of a partition may be described as the border line of the partition. Therefore, for example, the border line of partition A may be represented by coordinates of a series of points: [(168.121, 32.843), (168.211, 32.812), . . . ]. A polygon representing the partition A border can be determined based on the coordinates of a series of points.

If the coordinate points defining the border lines of respective partitions are stored in a mobility message gateway, the message gateway can directly determine the server to which an incoming message needs to be dispatched according to the location information contained in the message. It is a basic spatial operation to map a location coordinate to a corresponding polygonal area (geographical spatial partition), which completely belongs to prior art and can be performed with minor computational overheads. Applicant here does not describe its implementation details.

Figure 9:
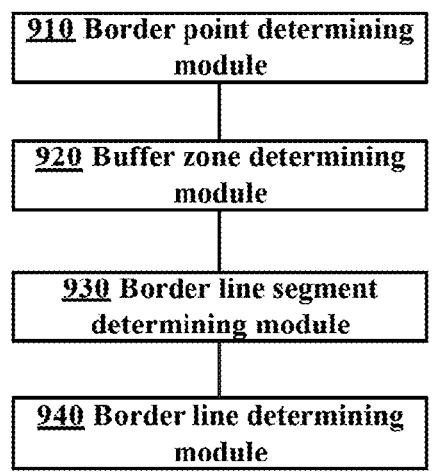
FIG. 9 shows a schematic block diagram of a system for determining a road network partitioning border line according to one exemplary embodiment of the present invention.

FIG. 9 shows a schematic block diagram of a system for determining a road network partitioning border line according to one exemplary embodiment of the present invention. According to the embodiments, the system includes a border point determining module 910 configured to determine a border point based on road network data and a buffer zone determining module 920 configured to determine a buffer zone between adjacent partitions based on the border point, partitioning information of road segments in the road network, and the road network data. The system also includes a border line segment determining module 930 configured to determine a border line segment between the adjacent partitions based on the buffer zone and a border line determining module 940 configured to determine a border line of at least one partition based on the border line segment.

In one embodiment, the border point determining module 910 comprises a module configured to for each node in the road network, determine partition information of a road segment connected to the node based on the road network data and partitioning information of road segments in the road network; and a module configured to, if the road segment connected to the node has different partitions, determine the node as a first kind of border points.

In another embodiment, the border point determining module 910 comprises: a module configured to determine an envelope of the road network based on the road network data; and a module configured to determine nodes on the envelope of the road network as a second kind of border points.

In one embodiment, the buffer zone determining module 920 comprises: a module configured to select a border point as a start point, and determine an initial road segment based on the start point; a module configured to proceed to a next road segment along a preset direction based on the initial road segment, till proceeding to the initial road segment; and a module configured to determine the buffer zone based on the road segment as traversed.

In a more specific embodiment, the module configured to select a border point as a start point, and determine an initial road segment based on the start point comprises: a module configured to select one of the first kind of border points and determine all road segments connected to the one of the first kind of border points and partitioning information of all road segments; and a module configured to determine a sector area formed by road segments corresponding to each partition among all road segments connected to the one of the first kind of border points, and to determine an outer side road segment forming an edge of the sector area; and a module configured to determine the initial road segment based on the outer side road segment.

In a further more specific embodiment, the module configured to select a border point as a start point, and determine an initial road segment based on the start point includes a module configured to select two of the second kind of border points that are adjacent but belong to different partitions and determine a road segment connecting the two of the second kind of border points as the initial road segment.

In one embodiment, the border line segment determining module 930 comprises: a module configured to perform a triangular partition to the buffer zone; and a module configured to determine the border line segment based on the border point and a central point of respective triangular areas after the triangular partition.

In another embodiment, the border line segment determining module 930 comprises: a module configured to determine a plurality of pairs of nodes, nodes in the pairs of nodes belonging to different partitions; and a module configured to determine a border line segment based on middle points of connection lines of the pairs of nodes and the border point.

In a further embodiment, the border line segment determining module 930 comprises: a module configured to extend, within the buffer zone, the angle bisector of an interior angle where a border point of the buffer zone is located to interact with a border of the buffer zone, to thereby form a first line segment; a module configured to start, from a middle point of the first line segment, to connect to another border node; and a module configured to, if the connection line is not intersected in the buffer zone with the border of the buffer zone, determine the border line segment based on the traversed connection lines; and a module configured to, if the connection line is intersected in the buffer zone with the border of the buffer zone to form a second line segment, take the second line segment as the first line segment to continue the above mentioned steps.

In one embodiment, the system shown in FIG. 9 further comprises: a module configured to store road network data of at least one road network partition in each server; and a module configured to in response to receiving a request containing location information, assign the request to a corresponding server based on the border line of respective partitions stored in the request assigning module.

The method or apparatus of the present application utilizes a buffer zone to determine a border line segment forming a border line when determining the road network partitioning border line, which ensures that each partitioning border line encompasses all road segments assigned to a corresponding road network-based partition, and meanwhile does not encompass or cut road segments of other partitions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for determining a road network partitioning border line, comprising:
    determining a border point based on road network data;
    determining a buffer zone between adjacent partitions based on the border point, partitioning information of road segments in a road network, and the road network data;
    determining a border line segment between the adjacent partitions based on the buffer zone; and
    determining a border line of at least one partition based on the border line segment.

2. The computer implemented method according to claim 1, wherein the determining a buffer zone comprises:
    selecting the border point as a start point, and determining an initial road segment based on the start point;
    proceeding to a next road segment along a preset direction based on the initial road segment, till proceeding to the initial road segment; and
    determining the buffer zone based on the initial road segment as traversed.

3. The computer implemented method according to claim 2,
    wherein the determining border points based on road network data comprises:
        for each node in the road network, determining partition information of a road segment connected to the node based on the road network data and partitioning information of road segments in the road network; and
        if the road segments connected to the node belong to different partitions, determining the node as a first kind of border points,
    wherein the selecting a border point as a start point and determining an initial road segment based on the start point comprises:
        selecting one of the first kind of border points and determining all road segments connected to the one of the first kind of border points and partitioning information of all road segments;
        determining a sector area formed by road segments corresponding to each partition among all road segments connected to the one of the first kind of border points, and determining an outer side road segment forming an edge of the sector area; and
        determining the initial road segment based on the outer side road segment.

4. The computer implemented method according to claim 2,
    wherein the determining a border point based on road network data comprises:
        determining an envelope of the road network based on the road network data; and
        determining nodes situated on the envelope of the road network as a second kind of border points,
    wherein the selecting a border point as a start point and determining an initial road segment based on the start point comprises: selecting two of the second kind of border points that are adjacent but belong to different partitions, and determining a road segment connecting the two of the second kind of border points as the initial road segment.

5. The computer implemented method according to claim 1, wherein the determining a border line segment between the adjacent partitions based on the buffer zone comprises:
    performing a triangular partition to the buffer zone; and
    determining the border line segment based on the border point and a central point of respective triangular areas after the triangular partition.

6. The computer implemented method according to claim 1, wherein the determining a border line segment between the adjacent partitions based on the buffer zone comprises:
    determining a plurality of pairs of nodes, nodes in the pairs of nodes belonging to different partitions; and
    determining a border line segment based on middle points of connection lines of the pairs of nodes and the border point.

7. The computer implemented method according to claim 1, wherein the determining a border line segment between the adjacent partitions based on the buffer zone comprises:
    extending, within the buffer zone, a angle bisector of an interior angle where a border point of the buffer zone is located to interact with a border of the buffer zone, to thereby form a first line segment;
    starting, from a middle point of the first line segment, to connect to another border node to form a connection line;
    if the connection line is not intersected in the buffer zone with the border of the buffer zone, determining the border line segment based on the connection lines; and
    if the connection line is intersected in the buffer zone with the border of the buffer zone to form a second line segment, taking the second line segment as the first line segment to continue the above mentioned steps.

8. The computer implemented method according to claim 1, further comprising:
    storing road network data of at least one road network partition in each server; and
    in response to receiving a request containing location information, assigning the request to a corresponding server based on a border line of respective partition.

9. A system for determining a road network partitioning border line, the system having a processor in communication with a memory, the processor comprising:
    a border point determining module configured to determine a border point based on road network data;
    a buffer zone determining module configured to determine a buffer zone between adjacent partitions based on the border point, partitioning information of road segments in a road network, and the road network data;
    a border line segment determining module configured to determine a border line segment between the adjacent partitions based on the buffer zone; and
    a border line determining module configured to determine a border line of at least one partition based on the border line segment.

10. The system according to claim 9, the buffer zone determining module comprises:
- a module configured to select the border point as a start point, and determine an initial road segment based on the start point;
- a module configured to proceed to a next road segment along a preset direction based on the initial road segment, till proceeding to the initial road segment; and
- a module configured to determine the buffer zone based on the initial road segment as traversed.

11. The system according to claim 10,
wherein the border point determining module comprises:
- a module configured to, for each node in the road network, determine partition information of a road segment connected to the node based on the road network data and partitioning information of road segments in the road network; and
- a module configured to, if the road segment connected to the node has different partitions, determine the node as a first kind of border points, wherein the module configured to select a border point as a start point, and determine an initial road segment based on the start point comprises:
- a module configured to select one of the first kind of border points and determine all road segments connected to the one of the first kind of border points and partitioning information of all road segments;
- a module configured to determine a sector area formed by road segments corresponding to each partition among all road segments connected to the one of the first kind of border points, and to determine an outer side road segment forming an edge of the sector area; and
- a module configured to determine the initial road segment based on the outer side road segment.

12. The system according to claim 10,
wherein the border point determining module comprises:
- a module configured to determine an envelope of the road network based on the road network data; and
- a module configured to determine nodes situated on the envelope of the road network as a second kind of border points, wherein the module configured to select a border point as a start point and determine an initial road segment based on the start point comprises: a module configured to select two of the second kind of border points that are adjacent but belong to different partitions and determine a road segment connecting the two of the second kind of border points as the initial road segment.

13. The system according to claim 9, wherein the border line segment determining module comprises:
- a module configured to perform a triangular partition to the buffer zone; and
- a module configured to determine the border line segment based on the border point and a central point of respective triangular areas after the triangular partition.

14. The system according to claim 9, wherein the border line segment determining module comprises:
- a module configured to determine a plurality of pairs of nodes, nodes in the pairs of nodes belonging to different partitions; and
- a module configured to determine a border line segment based on middle points of connection lines of the pairs of nodes and the border point.

15. The system according to claim 9, wherein the border line segment determining module comprises:
- a module configured to extend, within the buffer zone, a angle bisector of an interior angle where a border point of the buffer zone is located to interact with a border of the buffer zone, to thereby form a first line segment;
- a module configured to start, from a middle point of the first line segment, to connect to another border node to form a connection line;
- a module configured to, if the connection line is not intersected in the buffer zone with the border of the buffer zone, determine the border line segment based on the connection lines; and
- a module configured to, if the connection line is intersected in the buffer zone with the border of the buffer zone to form a second line segment, take the second line segment as the first line segment to continue the above mentioned steps.

16. The system according to claim 9, wherein the processor further comprises:
- a module configured to store road network data of at least one road network partition in each server; and
- a module configured to in response to receiving a request containing location information, assign the request to a corresponding server based on a border line of respective partition stored in a request assigning module.

17. A computer program product for determining a road network partitioning border line, the computer program product comprising:
- a non-transitory storage medium readable by a processing circuit and storing instructions for execution by the processing circuit for performing a method comprising:
  - determining a border point based on road network data;
  - determining a buffer zone between adjacent partitions based on the border point, partitioning information of road segments in a road network, and the road network data;
  - determining a border line segment between the adjacent partitions based on the buffer zone; and
  - determining a border line of at least one partition based on the border line segment.

18. The computer program product according to claim 17, wherein the determining a buffer zone comprises:
- selecting the border point as a start point, and determining an initial road segment based on the start point;
- proceeding to a next road segment along a preset direction based on the initial road segment, till proceeding to the initial road segment; and
- determining the buffer zone based on the initial road segment as traversed.

19. The computer program product according to claim 18, wherein the determining border points based on road network data comprises:
- for each node in the road network, determining partition information of a road segment connected to the node based on the road network data and partitioning information of road segments in the road network; and
- if the road segments connected to the node belong to different partitions, determining the node as a first kind of border points, wherein the selecting a border point as a start point and determining an initial road segment based on the start point comprises:
- selecting one of the first kind of border points and determining all road segments connected to the one of the first kind of border points and partitioning information of all road segments;

determining a sector area formed by road segments corresponding to each partition among all road segments connected to the one of the first kind of border points, and determining an outer side road segment forming an edge of the sector area; and determining the initial road segment based on the outer side road segment.

20. The computer program product according to claim 18, wherein the determining a border point based on road network data comprises:

determining an envelope of the road network based on the road network data; and determining nodes situated on the envelope of the road network as a second kind of border points, wherein the selecting a border point as a start point and determining an initial road segment based on the start point comprises: selecting two of the second kind of border points that are adjacent but belong to different partitions, and determining a road segment connecting the two of the second kind of border points as the initial road segment.

* * * * *